(12) United States Patent
Mashikian

(10) Patent No.: US 7,705,607 B2
(45) Date of Patent: Apr. 27, 2010

(54) DIAGNOSTIC METHODS FOR ELECTRICAL CABLES UTILIZING AXIAL TOMOGRAPHY

(75) Inventor: Matthew S. Mashikian, Storrs, CT (US)

(73) Assignee: Instrument Manufacturing Company, Storrs, CT (US)

( * ) Notice: Subject to any disclaimer, the term of this patent is extended or adjusted under 35 U.S.C. 154(b) by 243 days.

(21) Appl. No.: 11/844,516

(22) Filed: Aug. 24, 2007

(65) Prior Publication Data

US 2008/0048668 A1 Feb. 28, 2008

Related U.S. Application Data

(60) Provisional application No. 60/840,229, filed on Aug. 25, 2006.

(51) Int. Cl.
*G01R 31/11* (2006.01)
*G01R 31/08* (2006.01)

(52) U.S. Cl. ...................... 324/533; 324/527
(58) Field of Classification Search ............... 324/533, 324/532, 527, 512, 500
See application file for complete search history.

(56) References Cited

U.S. PATENT DOCUMENTS

| | | | |
|---|---|---|---|
| 1,943,391 A | | 1/1934 | Paine et al. |
| 4,887,041 A | | 12/1989 | Mashikian |
| 5,194,817 A | * | 3/1993 | Ward ...................... 324/544 |
| 5,272,439 A | | 12/1993 | Mashikian |
| 6,472,885 B1 | | 10/2002 | Green et al. |
| 6,521,695 B1 | | 2/2003 | Peruzzotti et al. |
| 6,972,574 B2 | * | 12/2005 | Allan et al. .............. 324/533 |
| 7,031,856 B2 | * | 4/2006 | Teich et al. ............... 702/65 |
| 7,495,450 B2 | * | 2/2009 | Furse et al. .............. 324/519 |

OTHER PUBLICATIONS

Mashikian M S Ed—Institute of Electrical and Electronics Engineers: "Preventive Diagnostic Testing of Underground Cables" 2001 IEEE/PES Transmission and Distribution Conference And Exposition. Atlanta, CA, Oct. 28-Nov. 2, 2001, IEEE/PES Transmission And Distribution Conference and Exposition, New York, NY: IEEE, US, vol. 1 of 2, Oct. 28, 2001, pp. 985-990, XP010568671 ISBN: 0-7803-7285-9.

Abdul Rahman M A, et al: "Diagnostic Testing for Assessment Of Distribution Cables" Properties And Applications Of Dielectric Materials, 2006. 8th International Conference ON, IEEE, PI, Jun. 2006, pp. 691-694, XP031009804 ISBN: 1-4244-0189-5.

European Search Report, Dated: Dec. 13, 2007.

Mashikian M S, et al.—Institute of Electrical And Electronics Engineers: "Medium Voltage Cable Defects Revealed by Off-Line Partial Discharge Testing at Power Frequency" Jul./Aug. 2006 IEEE, vol. 22, No. 4.

* cited by examiner

*Primary Examiner*—Hoai-An D Nguyen
(74) *Attorney, Agent, or Firm*—McCarter & English, LLP

(57) ABSTRACT

The present disclosure is directed to cable diagnostic test methods, systems and apparatus that advantageously utilize "standing wave" principles to facilitate the identification and location of defect(s) along a power cable. The disclosed methods/systems are effective in measuring dissipation factors and dielectric constants associated with shielded power cable insulation at any number of points or sections along the axial length of the cable. In essence, the disclosed methods/systems perform what may be termed axial tomography, allowing the dielectric loss or dissipation factor and the dielectric constant of the insulation as well as the resistance and inductance of the cable conductor system to be determined at one or more pre-determined points/sections of the cable along its axis.

16 Claims, 14 Drawing Sheets

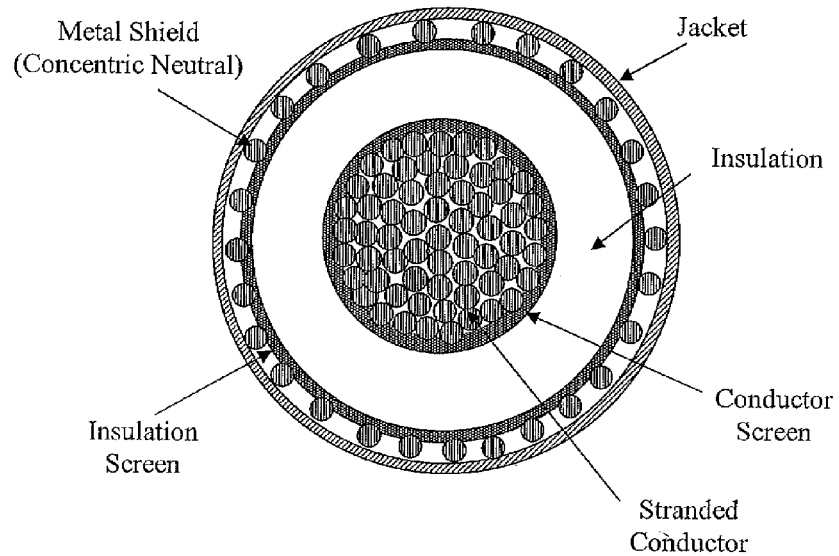
FIG. 1
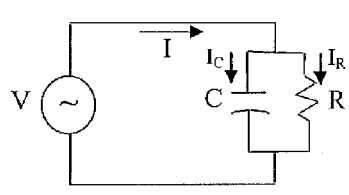
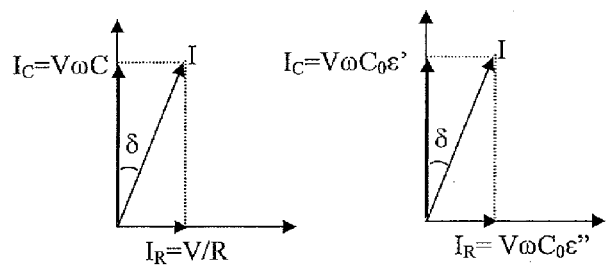
FIG. 2(a)      FIG. 2(b)      FIG. 2(c)

DIAGNOSTIC METHODS FOR ELECTRICAL CABLES UTILIZING AXIAL TOMOGRAPHY

CROSS-REFERENCE TO RELATED APPLICATION

The present application claims the benefit of a co-pending, commonly assigned provisional patent application entitled "Diagnostic Method for Electrical Cables Utilizing Axial Tomography Technique," which was filed with the U.S. Patent and Trademark Office on Aug. 25, 2006 and assigned Ser. No. 60/840,229. The entire content of the foregoing provisional patent application is incorporated herein by reference.

BACKGROUND

1. Technical Field

The present disclosure is directed to cable diagnostic test methods, systems and apparatus and, more particularly, to cable test methods, systems and apparatus that utilize "standing wave" principles to facilitate the identification and location of defect(s) along a power cable.

2. Background Art

With reference to FIG. 1, conventional shielded power cables generally consist of a conductor, normally fabricated from copper or aluminum, surrounded by a thin concentric semi-conducting screen, referred to as the conductor screen. The conductor screen, in turn, is surrounded by a concentric layer of insulation, the thickness of which increases with the voltage rating of the cable. This layer of insulation, in turn, is covered with a second thin concentric semi-conducting screen, referred to as the insulation screen. A concentric metal shield, in the form of concentric wires, overlapping metal tapes or other similar structure surrounds this screen. The entire assembly is housed in an insulating jacket which protects the cable against water ingress as well as physical and chemical damage. The cable conductor is typically maintained at an elevated voltage, while the outer metal shield is maintained at ground potential. Whereas the cable components may be based on different designs, modern cable insulation is generally of the following two types: (a) oil-impregnated paper or oil-impregnated polymer tape (laminated construction), and (b) extruded dry polymer. The cables are described as having a co-axial configuration.

As cables age in service, their insulation layers may develop weaknesses which pose a risk of precipitating a cable failure. As a result of aging, laminated insulation could become weaker over its entire length, but more often will develop discrete weaknesses as a result of water ingress, lack of sufficient oil or other structural and/or ambient conditions. Extruded polymer insulation is known to age in discrete locations due to voids, impurities, protrusions, water diffusion in the shape of trees ("water trees") and other anomalies. Efforts have been made to address the properties and performance of polymer insulation compositions. See, e.g., U.S. Pat. No. 6,521,695 to Peruzzotti et al. Nonetheless, limitations associated with polymer insulations used in power cable manufacture, in conjunction with impurities or other conditions which force the electric stress to become concentrated, could produce carbonized defects in the shape of trees, called electrical trees, and eventually lead to early/undesirable cable failures.

Cable owners want to extend as much as possible the useful operating life of their cables while avoiding outages during normal service. The cables are, therefore, subjected to an initial commissioning test right after installation, and to periodic diagnostic tests (maintenance tests) during service to identify and correct any possible weaknesses. Excluding high-potential ("hipot") withstand tests, diagnostic tests generally belong to one of two general categories: (a) global assessment of the insulating condition of the cable, and (b) assessment by partial discharge of discrete weaknesses. The following specific tests are commercially available under each category:

(a) Global Condition Assessment

Global condition assessment tests are generally designed to assess overall deterioration of certain insulating (dielectric) properties of the cable. Three specific test methods are noted:

Measurement of the dissipation factor of the overall cable when subjected to various voltage levels at one fixed frequency (such as 50/60 Hz, or 0.1 Hz). The dissipation factor is often referred to as tangent delta (the trigonometric tangent of the angle by which the total current drawn by the cable differs from that drawn by an equivalent ideal capacitor without loss). The tangent delta (tan δ) is a measure of the dielectric losses in the cable.

Measurement of the global dissipation factor and dielectric constant of the entire cable as a function of various frequencies while the voltage may assume several different levels. This method is also referred to as dielectric spectroscopy.

Measurement of the time it takes for a cable to recover its voltage after it has been charged to a certain voltage level with a direct current (dc) and momentarily shorted or, alternatively, the magnitude of the recovered voltage in a given time. Another dual method is the measurement of current as a function of time after having permanently shorted the cable. The first method is often referred to as "the return voltage" method, and the second as the "relaxation current" method. Both methods are based on dielectric polarization/relaxation principles.

(b) Partial Discharge Measurement

Discrete defects often emit a very small electrical signal of very short duration (a partial discharge) when the cable is subjected to a voltage stress exceeding a threshold, or inception, level. Like radar technology, the site of a partial discharge can be accurately located by means of methods based on traveling electromagnetic waves and their reflections.

Additional prior art techniques for detecting faults and defects in electrical cables are described in the patent literature. U.S. Pat. No. 4,887,041 to Mashikian et al. describes a method and apparatus for detecting the locations of incipient faults in an insulated power line. In an exemplary embodiment of the Mashikian '041 patent, the method involves opening one end of the power line (if it is not suitably terminated to reflect high frequency pulses), applying an excitation voltage to the other end of the power line at an excitation point, detecting a first high frequency pulse produced by a discharge in the power line and transmitted on the power line to the excitation point, detecting a first reflection of the pulse from the open end of the power line to the point of excitation, detecting the travel time of a reflection of the first pulse from the excitation point to the open end of the power line and return to the excitation point, and dividing the time between the detection of the first pulse and the first reflected pulse by the detected travel time. The Mashikian '041 patent further discloses methods that detect discharge pulses which occur in a predetermined range of magnitude of the excitation voltage and discharge pulses which reside within predetermined ranges of magnitudes. The discharge sites may be detected using either reflected voltage pulses or reflected current pulses.

A further prior art teaching is provided in U.S. Pat. No. 5,272,439 to Mashikian et al. The Mashikian '439 patent discloses a method and apparatus for locating an incipient fault at a point along the length of an insulated power line that, in exemplary embodiments, involves the application of an excitation voltage at an open end of the power line. The signal pulse transmitted along the power line to the open end is passed through a high pass filter to remove the portion of the signal which is at a frequency below the excitation voltage and its harmonics. The filtered signal is amplified and passed through a band pass filter to remove a high frequency portion of the signal containing a large proportion of noise relative to the frequency of the partial discharge frequency from the incipient fault. This filtered signal is passed to a digital storage device adapted to be triggered by a signal of a predetermined amplitude, and the triggered digital storage device receives the amplified signal directly from the amplifier and stores digital data concerning amplitude and time for the peaks of the amplified signal for a predetermined period of time. The stored digital data is processed to identify the peaks reflecting the point of partial discharge in the power line.

Practical adaptations of the foregoing partial discharge location methods and their usefulness in performing diagnostic tests on installed cables are described in several technical publications, a recent typical example of which is an article published in the July/August 2006 issue of the IEEE Electrical Insulation Magazine, Vol. 22, No. 4, entitled "Medium-Voltage Cable Defects Revealed by Off-Line Partial Discharge Testing at Power Frequency," by M. Mashikian and A. Szatkowski.

Partial discharge diagnostic methods are generally effective in finding cavities, indentations made with tools, screen or shield protrusions, and electrical trees in cables with extruded polymer insulation. Such methods are also generally effective in locating defective areas in oil-impregnated laminated insulation due to such causes as lack of oil, embrittled paper with carbonized tree-like formation (commonly referred to as tracking) and/or water globules. However, partial discharge techniques are not effective in directly identifying the location of water trees in extruded polymer insulation, nor are such methods effective in identifying/locating non-condensed moisture in oil-impregnated laminates. In that regard, it is noted that moisture—without the existence of condensed water could constitute an important cause of failure in oil-impregnated paper insulated cables. Moisture, water and water trees lead to a localized increase in the dissipation factor and, possibly, the dielectric constant of the insulation. Despite the significance of these factors in cable performance, a global condition assessment test may be unable to detect this condition without ambiguity, at least in part because such methods provide average values covering the entire cable length. None of the global condition assessment methods can localize such discrete defects and, unless discrete defects are located with precision, the diagnostic method loses its attractive economic advantage and overall value/reliability.

Accordingly, a need remains for methods, systems and apparatus for detecting and locating with precision defects and potential defects in power cables. These and other needs are satisfied by the methods, systems and apparatus disclosed herein.

SUMMARY

The present disclosure is directed to cable diagnostic test methods, systems and apparatus that advantageously utilize "standing wave" principles to facilitate the identification and location of defect(s) along a power cable. The disclosed methods/systems are effective in measuring dissipation factors and dielectric constants associated with shielded power cable insulation at any number of points or sections along the axial length of the cable. The disclosed methods/systems are also effective in determining localized changes in the resistance and inductance of a cable, i.e., parameters associated with the cable conductor. In essence, the disclosed methods/systems perform what may be termed axial tomography, allowing the dielectric loss or dissipation factor and the dielectric constant of the insulation as well as the resistance and inductance of the cable conductor system to be determined at one or more pre-determined points/sections of the cable along its axis.

According to exemplary embodiments of the present disclosure, the disclosed axial tomography technique for locating cable defects may be employed at various operating frequencies, such as 10-1000 kHz (at the high end), and 50 or 60 Hz, 1 Hz, 0.1 Hz, etc. (at the low end). By operating across a range of frequencies, the disclosed technique effectively functions as what may be termed "spectro-tomography," combining axial tomography with dielectric spectroscopy. Additional advantageous features, functions and benefits of the disclosed systems, methods and apparatus will be apparent from the detailed description which follows.

BRIEF DESCRIPTION OF THE FIGURES

To assist those of ordinary skill in the art in making and using the disclosed systems, methods and apparatus, reference is made to the accompanying figures, wherein:

FIG. 1 is a cross-sectional view of a conventional power cable;

FIGS. 2(a), 2(b) and 2(c) are circuit equivalents of a shielded power cable insulation;

DESCRIPTION OF EXEMPLARY EMBODIMENT(S)

The disclosed cable diagnostic test methods, systems and apparatus utilize "standing wave" principles to identify and locate defect(s) along a power cable. As described herein, the disclosed methods/systems are effective in measuring dissipation factor (tan δ) and dielectric constant ($\epsilon'$) associated with the insulation of a power cable, as well as the resistance ($R_c$) and inductance ($L_c$) associated with the conductor system, at discrete points along the cable's axial length. The disclosed methods/systems offer significant advantages for cable testing and related defect identification/location.

With reference to FIG. 2(a), the schematic circuit diagram represents a shielded power cable insulation subjected to an alternating voltage source, $V=V_m \sin(\omega t)$, where $V_m$ is the amplitude of the voltage and $\omega=2\pi f$ is the angular frequency, f being the frequency in Hz. The cable insulation is shown as a pure capacitance, C, across which is connected a resistance, R, representing the dielectric losses. C is expressed in Farads and R in Ohms. FIG. 2(b) is a "phasor" diagram showing the current, $I_C$, drawn by the ideal capacitor, the current, $I_R$, drawn by the resistor, and the total current I, which is the sum of the two previously mentioned currents. The angle, $\delta$, between I and $I_C$ is called the dissipation factor angle and represents the effect of the dielectric loss occurring in the cable insulation. The dissipation factor, defined as $\tan \delta$, can be shown to be equal to $1/\omega RC$.

An alternative equivalent notation, often used by physicists (as opposed to engineers), is as follows. The cable is assumed to be represented by the following complex capacitance rather than by a combination of a resistance in parallel with a capacitance: $C^*=C_0(\epsilon'-j\epsilon'')$, where $\epsilon'$ is called the dielectric constant, $\epsilon''$ the dissipation index, and $C_0$ the geometric capacitance (capacitance of the same cable construction having air as its insulating medium) of the cable insulation. The quantity "j" is the square root of the negative quantity "−1". The current, I, drawn by this complex capacitance is, therefore: $I=V \times j\omega C = V\omega C_0(\epsilon''+j\epsilon')$. The phasor diagram is redrawn in FIG. 2(c) on the basis of this new form of the current, I. The trigonometric tangent of the angle $\delta$, $\tan \delta$, is now expressed as the ratio $\epsilon''/\epsilon'$. The advantage of this notation is that the axial tomography test would allow $\epsilon'$ and $\epsilon''$, as well as $\tan \delta$, to be determined. The two previous representations are equivalent to each other in accordance with the following relationships:

$$C=\epsilon' C_0 \text{ and } 1/R=\omega C_0 \epsilon''$$

Figure 3A:
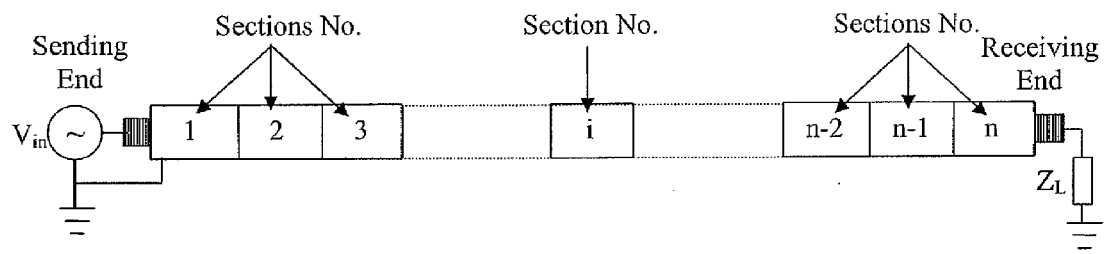
FIG. 3(a) is a diagram showing an exemplary cable divided into "n" equal sections along its axial length, wherein the cable is energized by a voltage "$V_{in}$" and terminated with a load impedance $Z_L$.
Figure 3B:
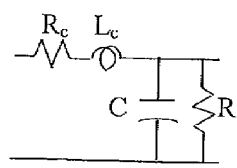
FIG. 3(b) is the electric circuit representation of each cable section in FIG. 3(a).

The cable conductor is represented as a series combination of a frequency dependent resistance, $R_c$, and an inductive reactance, $\omega L_c$, as shown in FIG. 3(b).

Turning to FIG. 3(a), the voltage source at the sending end of the cable supplies a complex power, $S_{in}$, which is the sum of the real Power, $P_{in}$, and the reactive power, $Q_{in}$, related to each other by the following relationship:

$$S_{in}=V_{in} \times I_{in}^* = P_{in}+jQ_{in} \qquad [1]$$

The quantity $I_{in}^*$ denotes the complex conjugate of the input current, $I_{in}$. A similar relationship exists at the receiving, or load, end of the cable:

$$S_L=V_L \times I_L^* = P_L+jQ_L \qquad [2]$$

The complex power dissipated in the cable consists of two components, the first is the complex power, $S_c$, dissipated in the cable conductor, and the second is the complex power, $S_d$, dissipated in the dielectric material, or the insulation, of the cable. As a cable ages, except in few exceptional cases, the complex power dissipated in the conductor remains constant, while that dissipated in the cable insulation tends to increase. All existing global diagnostic tests are intended to determine the changes in the power dissipation of the cable insulation. In the present disclosure, the conductor impedance, $R_c+j\omega L_c$, is allowed to vary, as well, along the cable axis. Applying the principle of conservation of energy to this situation, the complex power, $S_d$, dissipated in the insulation, is found by the relationship:

$$S_d=S_{in}-S_L-S_c \qquad [3]$$

Splitting equation [3] into its real and imaginary components, the following relationships are obtained:

$$P_d = \sum_i V_i^2 \omega C_i \tan \delta_i = \sum_i V_i^2 \omega C_o \epsilon_i'' = P_{in} - P_L - \sum_i I_i^2 R_{ci} \qquad [4]$$

$$Q_d = \sum_i V_i^2 \omega C_i = \sum_i V_i^2 \omega C_o \epsilon_i' = Q_{in} - Q_L - \sum_i I_i^2 \omega L_{ci} \qquad [5]$$

Equations similar to [4] and [5] can be written for various values of load impedance, $Z_L$, source impedance, $Z_s$ and frequency, $\omega$. If the cable is divided into n sections (not necessarily of equal dimension), a minimum of n equations are needed to solve these equations. The solution will determine the values of $\tan \delta$ and C, or $\epsilon'$ and $\epsilon''$ for each section along the cable axial length, thus providing an axial tomogram of the cable insulation. The foregoing process is typically implemented in two distinct steps: first, the conductor is assumed to be homogeneous and the variations of insulation parameters are computed. On the basis of these values, the voltage and current profiles along the cable are re-calculated. In a second step, equations [4] and [5] are solved, assuming the calculated values of the insulation parameters are known, while the conductor parameters, $R_c$ and $L_c$, are the unknown variables. Through an iterative process, all conductor and insulation parameters are calculated, such that four (4) different axial tomograms can be generated.

With this mathematical context, the systems and methods of the present disclosure establish the voltage and current profiles along the cable using the principle of "standing waves." For purposes of the disclosed methods/systems, standing wave principles are utilized by establishing an alternating voltage at relatively high frequency, generally on the order of 10-1000 kilohertz (kHz) on the power cable to be tested. The voltage is connected across the cable at the "sending" end (see schematic depiction in FIG. 3(a)). This voltage sets up a traveling wave pattern, which is reflected at the opposite "receiving" end of the cable. The combination of the forward traveling wave and its reflection sets up a "standing wave" pattern within the cable. Of note, each cable section is subjected to an alternating voltage of frequency $\omega$, but with different amplitude. More particularly, a voltage wave travels from the voltage source toward the load at a velocity which is influenced by such parameters as the cable materials and cable construction. The forward moving voltage may be denoted as $V^+$. At the load, a portion of the wave is reflected, establishing a voltage $V^-$. The reflected portion of the voltage wave is determined by the value of the load impedance and the cable characteristic impedance. The reflected portion of the traveling wave can be determined mathematically if the load impedance, $Z_L$, connected at the receiving end of the cable and the characteristic impedance, $Z_0$, of the cable are known. Once the reflected portion of the traveling wave has been determined/calculated, it is possible to calculate the "standing wave" voltage and current at any point or section along the axial length of the cable. Indeed, at any point/section along the cable, the instantaneous voltage (or current) is the sum $V^++V^-$ (or $I^++I^-$) based on the waves traveling in the forward and reflected directions, respectively. Inasmuch as both waves are sinusoidal, the summation of the two waves is also sinusoidal.

The voltage and current patterns can be determined either through the application of conventional standing wave equations, or from the solution of the discrete circuit representation of FIG. 3(a), where the sections need not have the same length. Initially, the values of voltage and current are based on the global values of the cable parameters $R_c$, $L_c$, C and R, obtained for known load conditions, including short and open-circuit conditions, by direct measurements of voltage and current quantities at the sending and receiving cable ends. These initial values of the cable parameters can be modified, iteratively, as the solutions of equations such as [4] and [5] are obtained.

Figure 5:
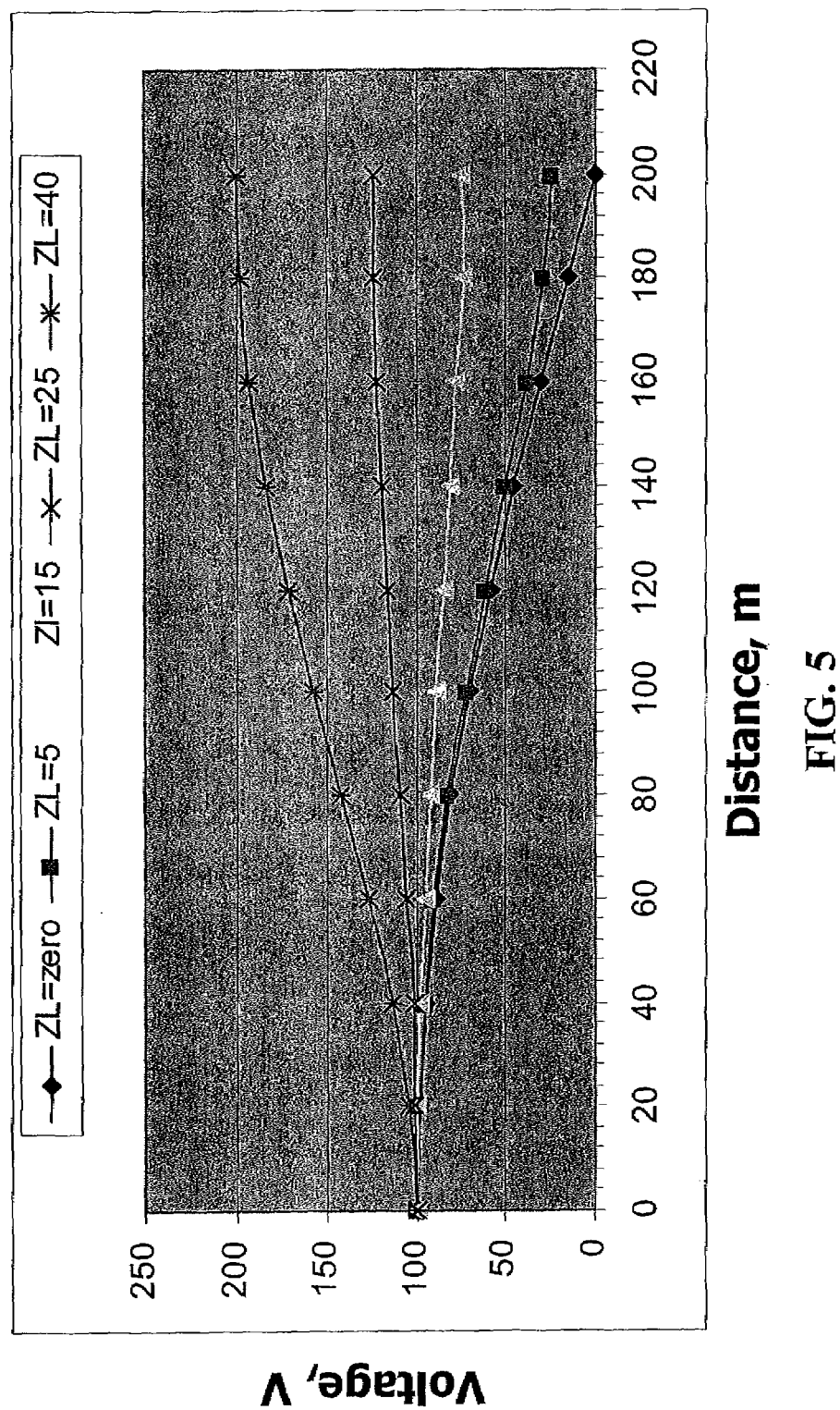
FIGS. 5-7 are voltage plots for an exemplary homogenous cable according to the present disclosure.
Figure 6:
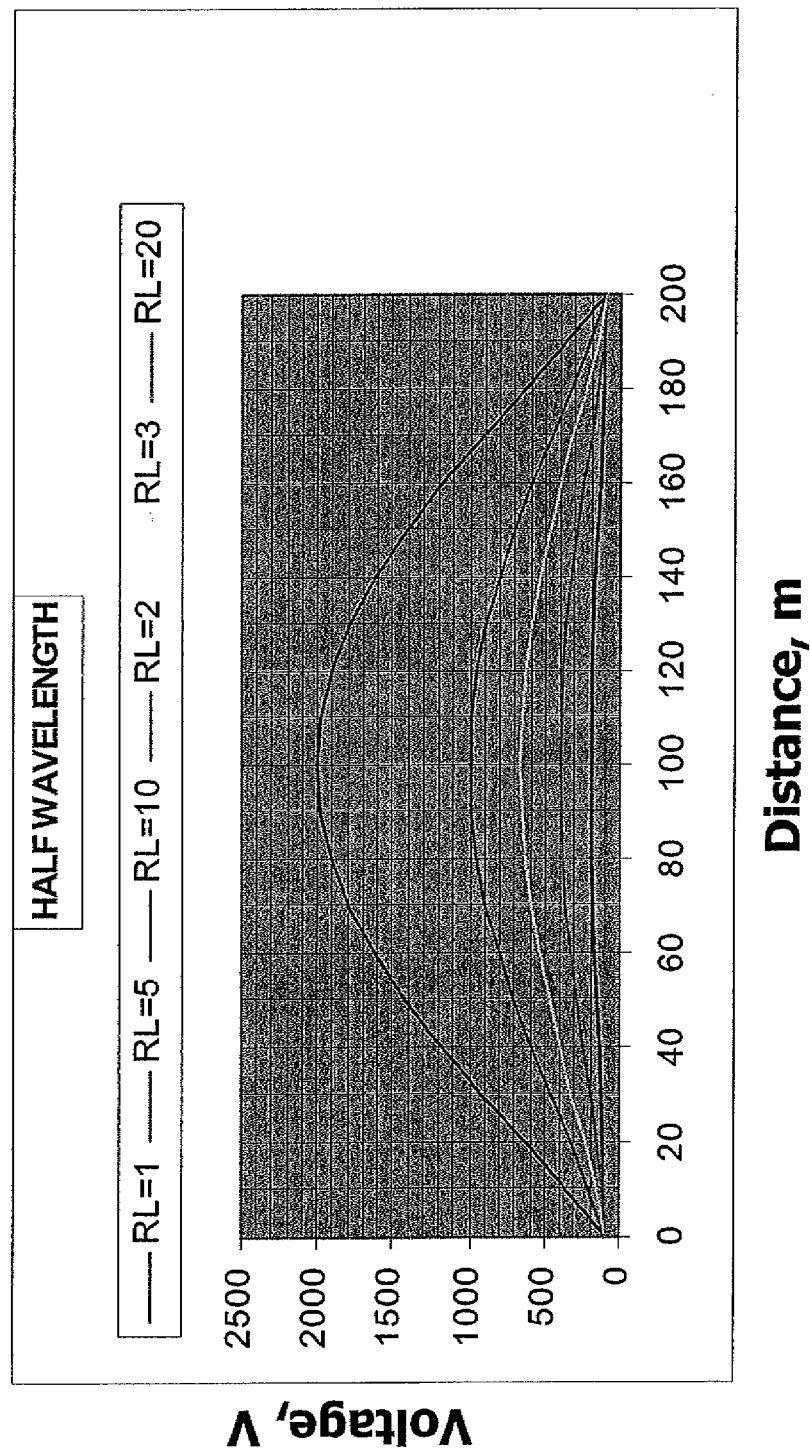
Figure 7:
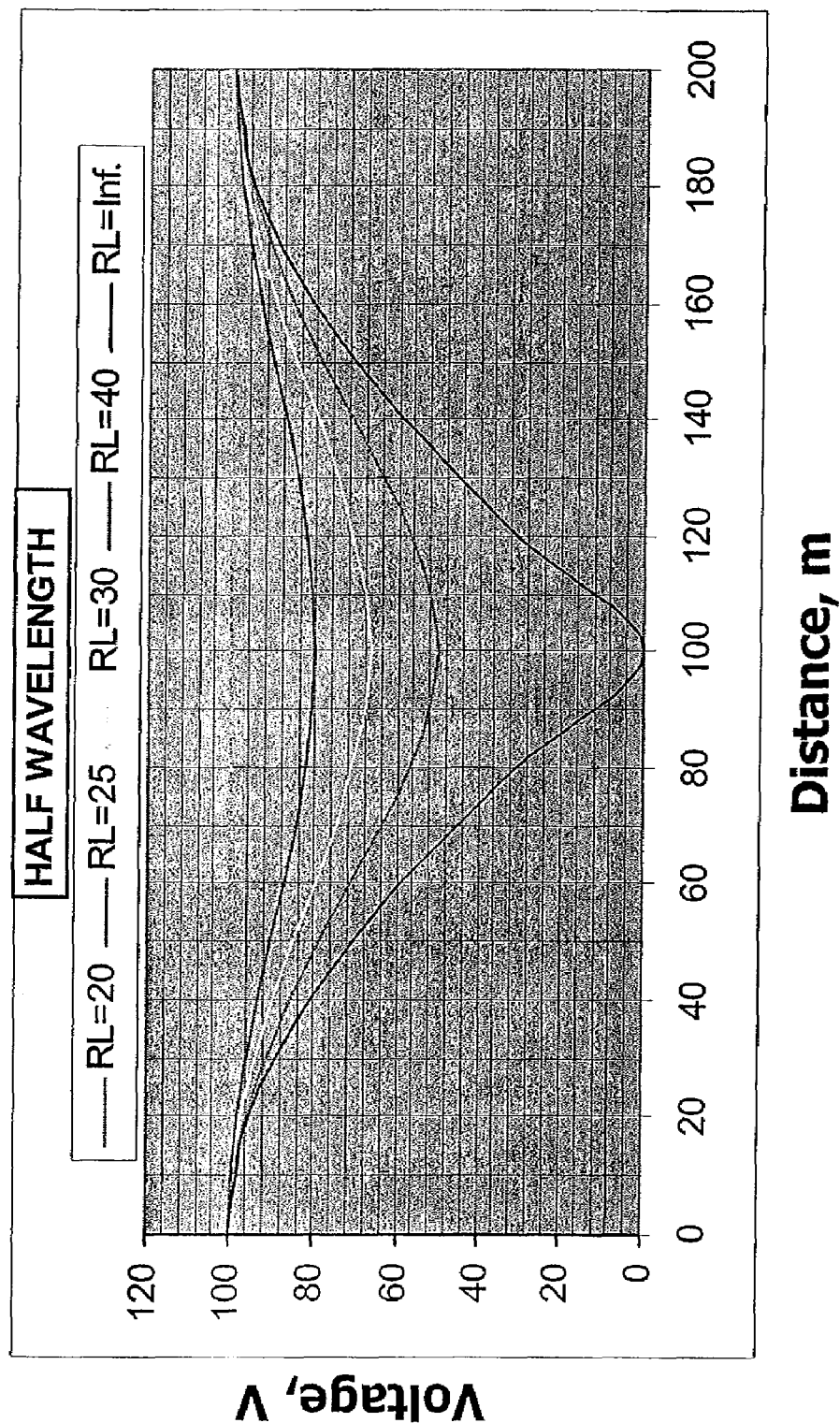

Absent changing conditions, the combination forms a wave that appears to be stationary (not moving or "standing" still). In reality, each point along the cable is subjected to a sinusoidal voltage of the same frequency as the source frequency; however, at each point/section, the amplitude of the resulting voltage is different. Each standing voltage wave is also accompanied by a standing current wave. With reference to FIGS. 5-7, experimental results are plotted for an exemplary homogeneous cable having the following characteristics/parameters and test conditions:

Length (L)=200 m
Wave velocity (u)=160 m/μs
Frequency (f)=200 kHz (FIG. 5); 400 kHz (FIGS. 6-7)
Wavelength (λ)=800 m; 400 m
Cable characteristic impedance ($Z_0$)=20Ω

As shown in the foregoing plots, the voltage amplitude at various axial positions along the cable are calculated based on the test conditions according to the present disclosure.

Figure 8:
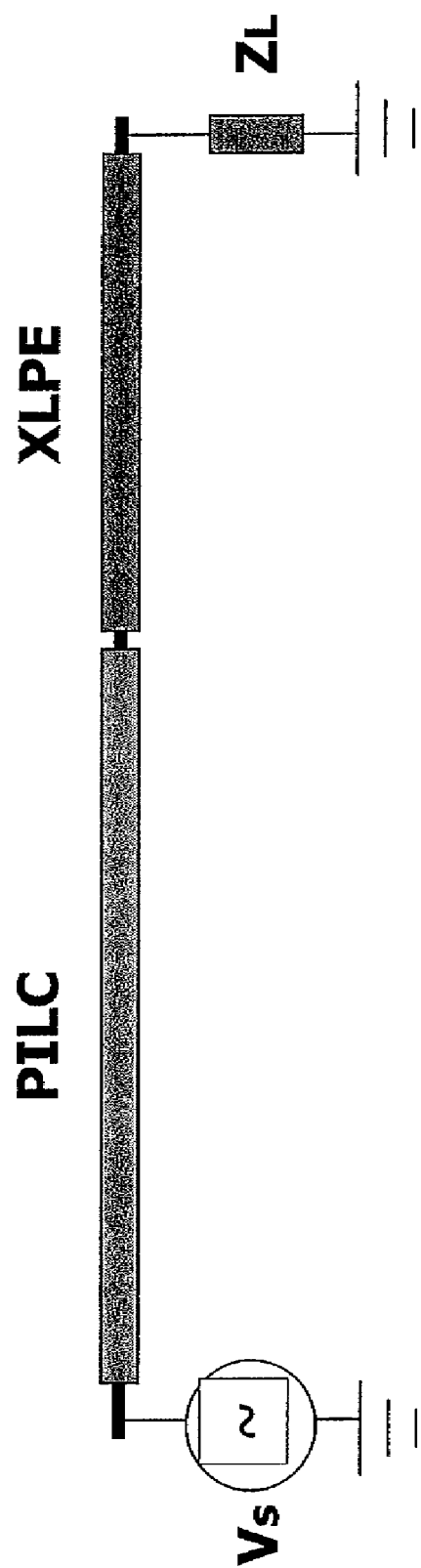
FIG. 8 is a schematic diagram of an exemplary mixed cable configuration according to the present disclosure.
Figure 9:
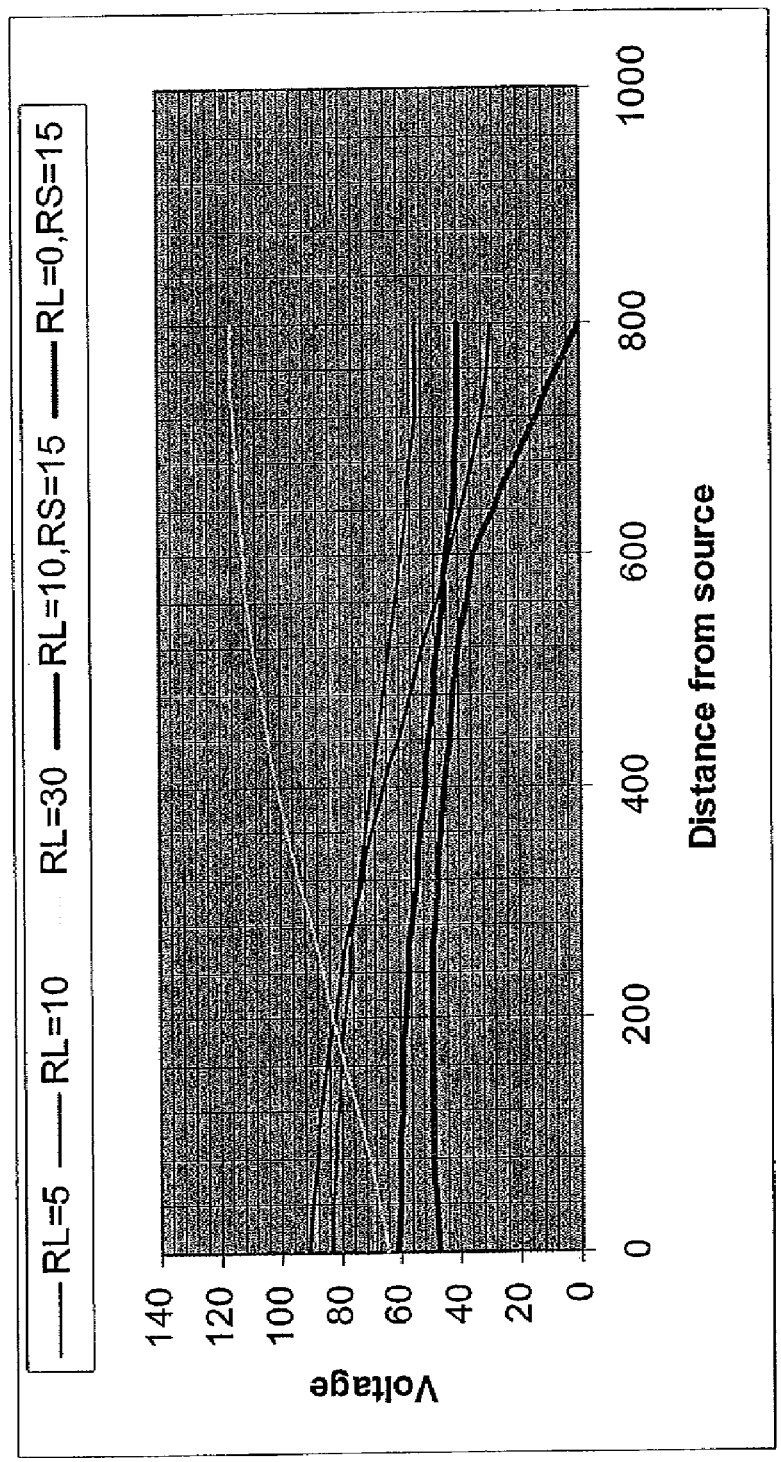
FIGS. 9-10 are voltage plots for an exemplary mixed cable configuration according to the present disclosure.
Figure 10:
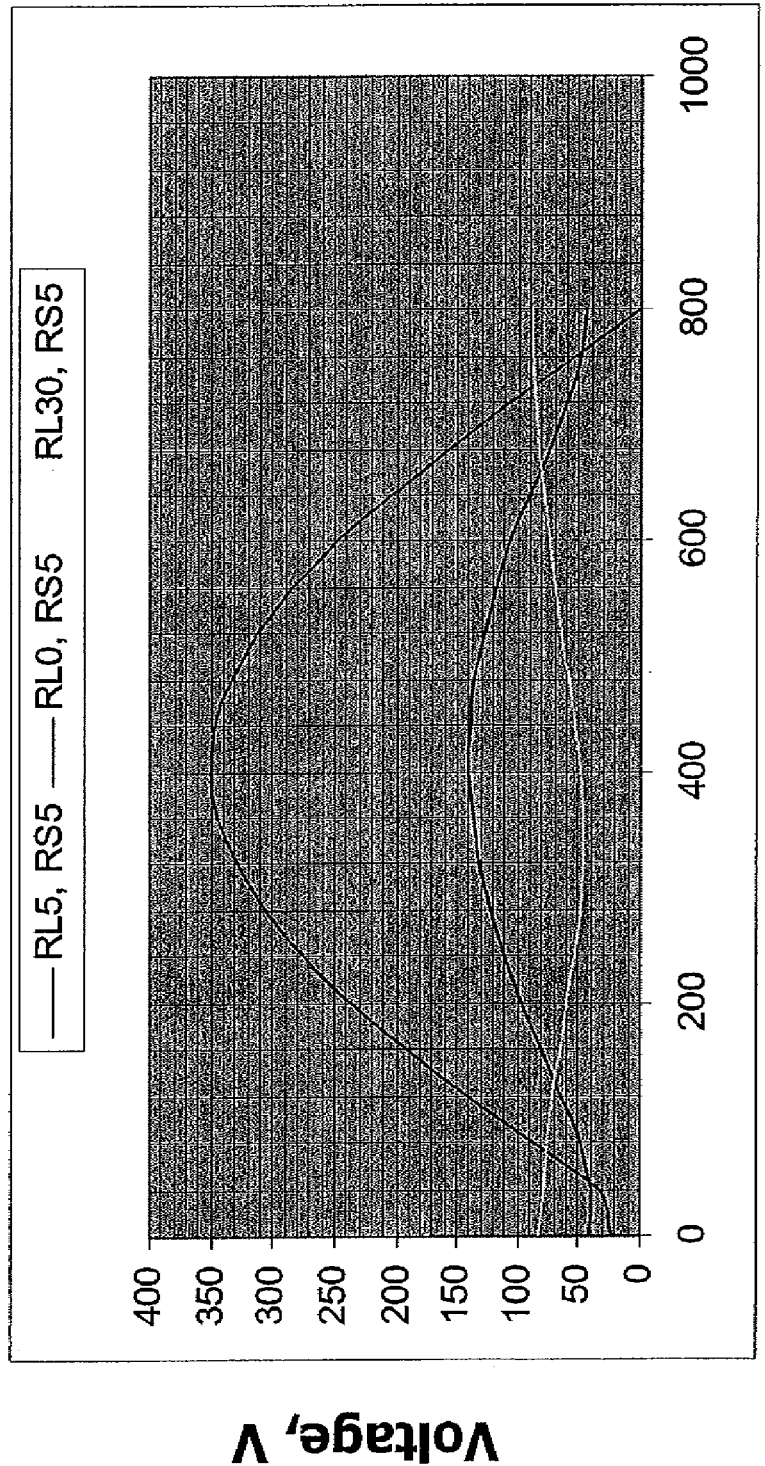

With reference to FIG. 8, an exemplary mixed cable configuration is schematically depicted. The mixed cable includes a first portion/component that is fabricated from crosslinked polyethylene (XLPE) and a second portion/component that is fabricated with an oil-impregnated paper-insulated lead-covered (PILC) cable. With reference to FIGS. 9-10, experimental results are plotted for the noted mixed cable configuration having the following characteristics/parameters and test conditions:

PILC
Cable characteristic impedance ($Z_0$)=15Ω
Length (L)=600 m
Wave velocity (u)=140 m/μs
XLPE
Cable characteristic impedance ($Z_0$)=18Ω
Length (L)=200 m
Wave velocity (u)=160 m/μs
Source Impedance
Rs=0 or 15Ω

As shown in FIGS. 9-10, voltage amplitudes are measured/derived for various points/sections along the length of the exemplary mixed cable configuration described herein at frequencies of 200 kHz and 90 kHz according to the present disclosure.

Figure 11:
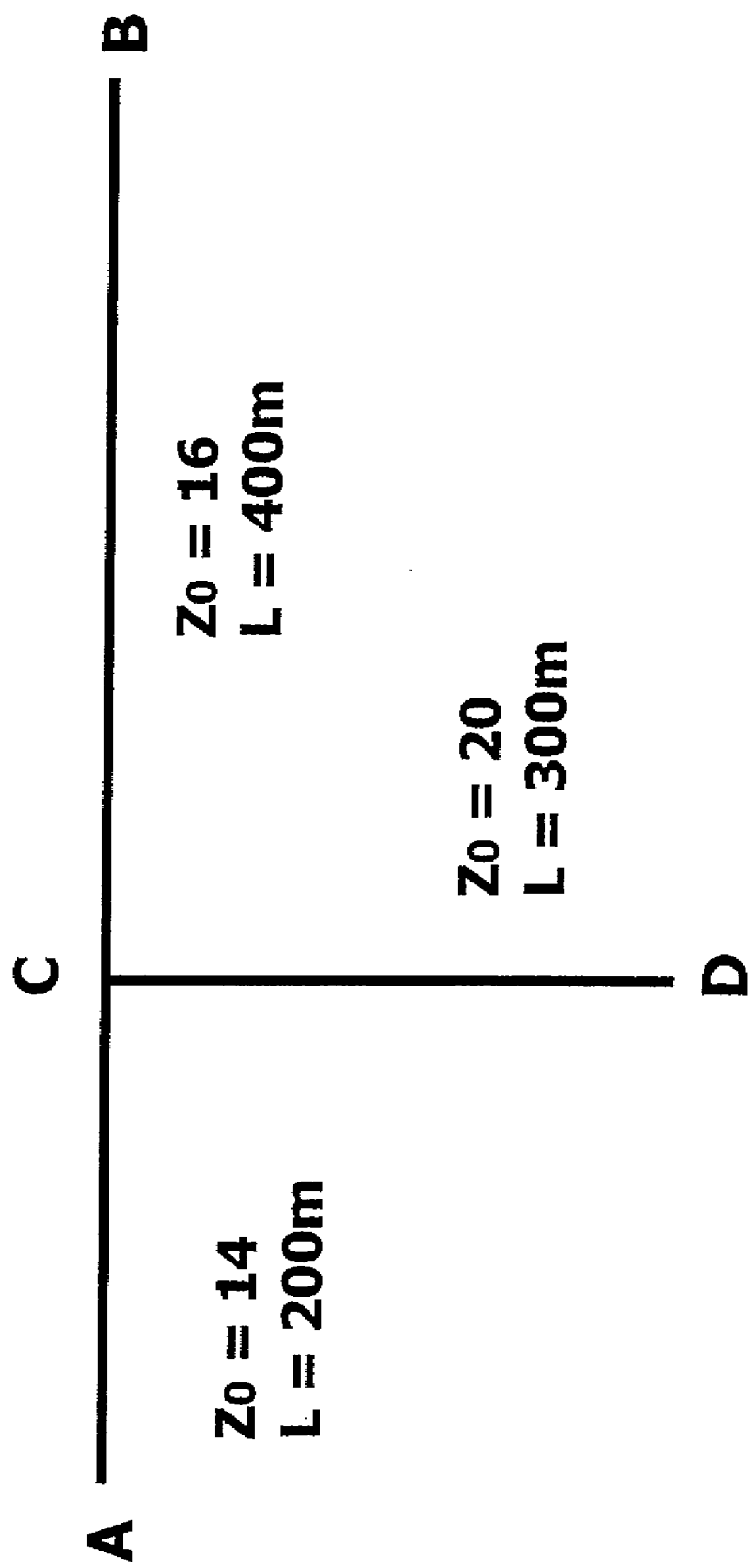
FIG. 11 is a schematic diagram of an exemplary branched cable according to the present disclosure.
Figure 12:
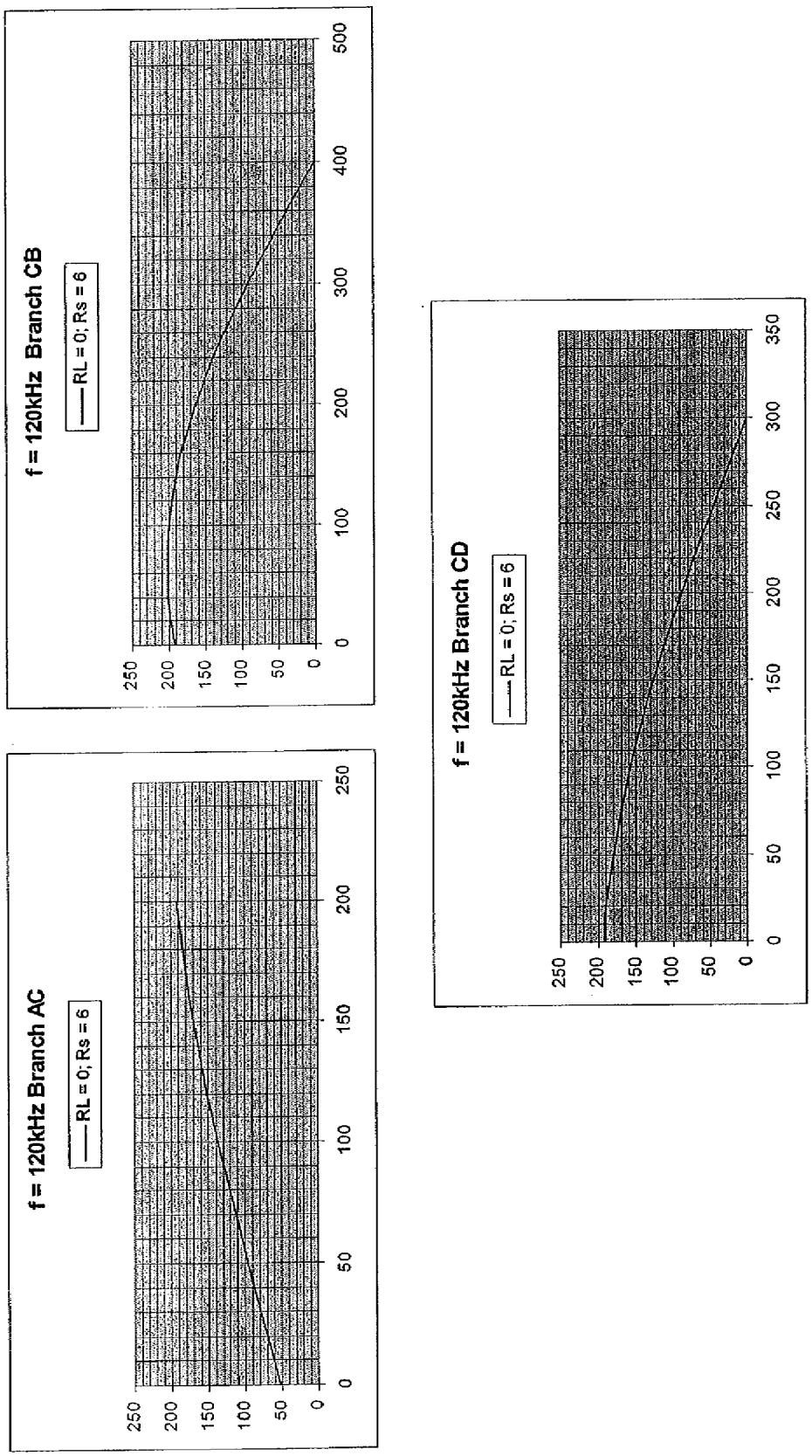
FIGS. 12-14 are voltage amplitude plots for the exemplary branched cable at three distinct frequencies.
Figure 13:
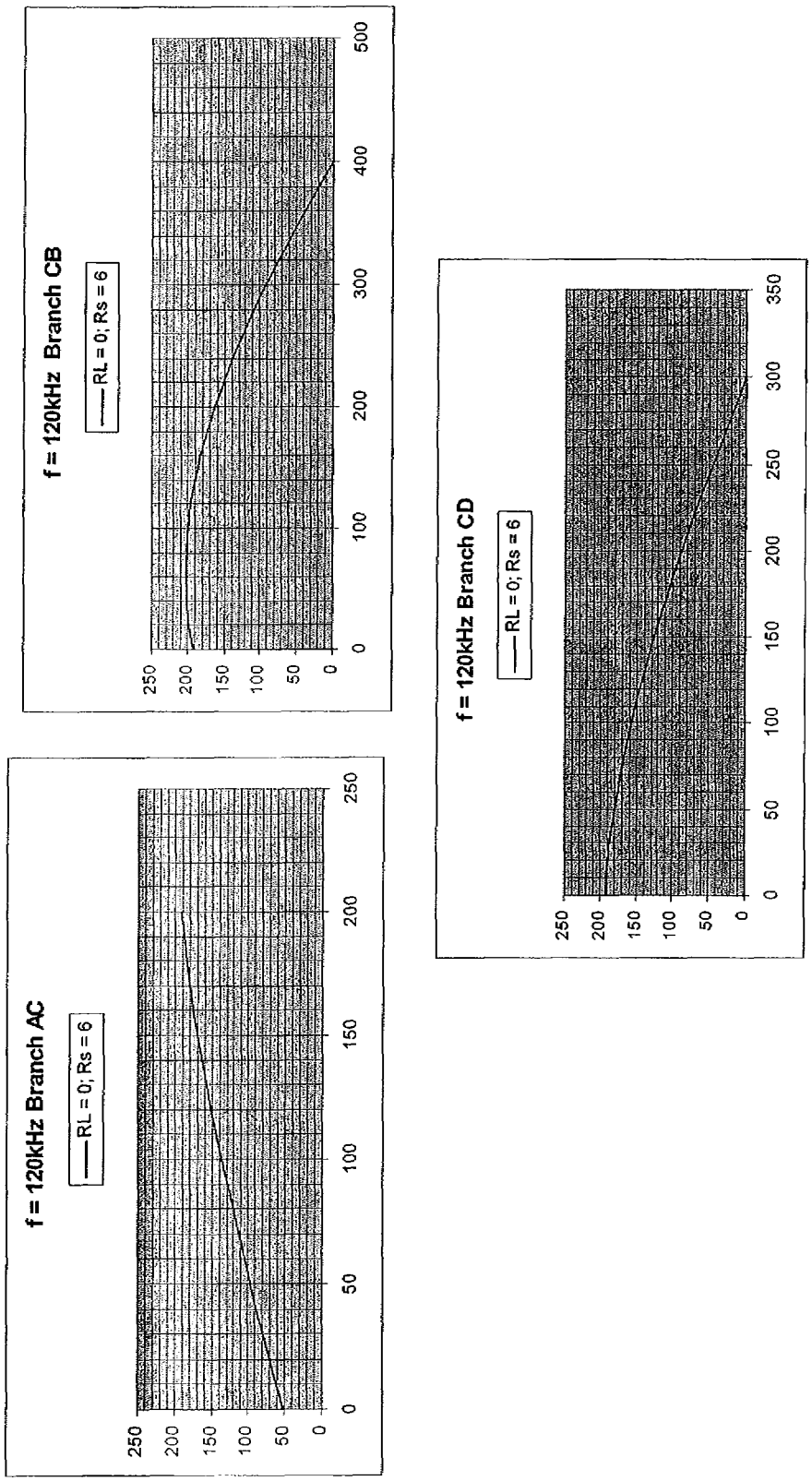
Figure 14:
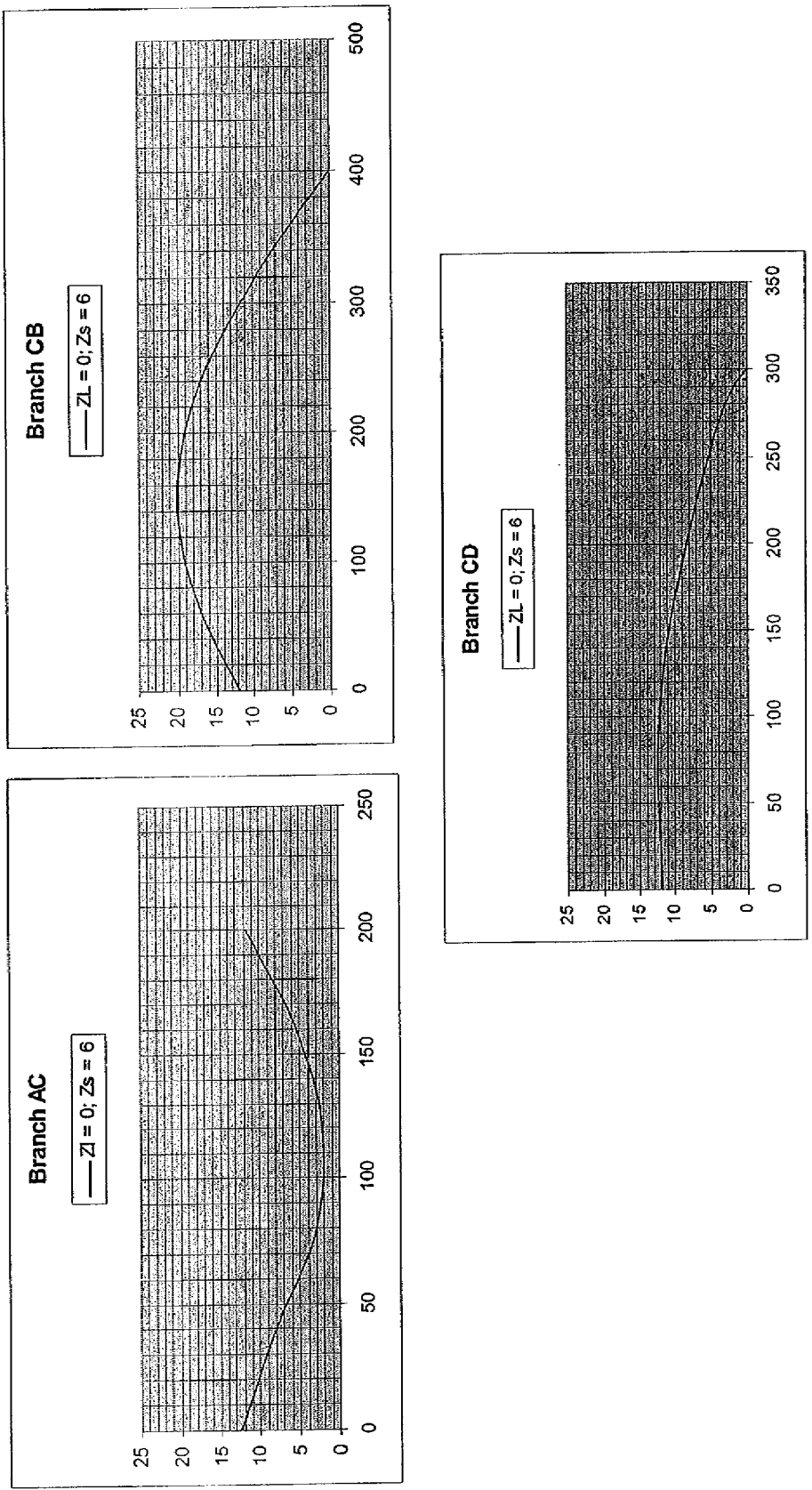

Turning to FIG. 11, a schematic diagram of an exemplary branched cable is provided. Incorporated into the schematic depiction of FIG. 11 are characteristics/parameters associated with an exemplary embodiment thereof. Voltage amplitudes for the exemplary branched cable are provided in the plots of FIGS. 12-14. As shown therein, voltage amplitudes are measured/derived for axial locations along the respective cable branches at frequencies of 80 kHz, 120 kHz, and 160 kHz.

By varying the load impedance, the source impedance or the frequency of the voltage source, or all three, a number of times (e.g., "n" times or more), the needed equations to solve for tan $\delta_i$ can be advantageously established. Of note, the dissipation factor at these high frequencies should not change significantly with a modest variation in frequency, and therefore may be assumed to be constant. However, this assumption is not a necessary condition to apply the disclosed method and, in further exemplary embodiments of the present disclosure, potential dissipation factor variations due to frequency variations may be included in the mathematical equations associated with the disclosed systems/methods. If necessary or desired, the same operation can be conducted by exchanging the sending end and the receiving end of the cable, generating half of the equations needed in each of these operations.

Figure 15:
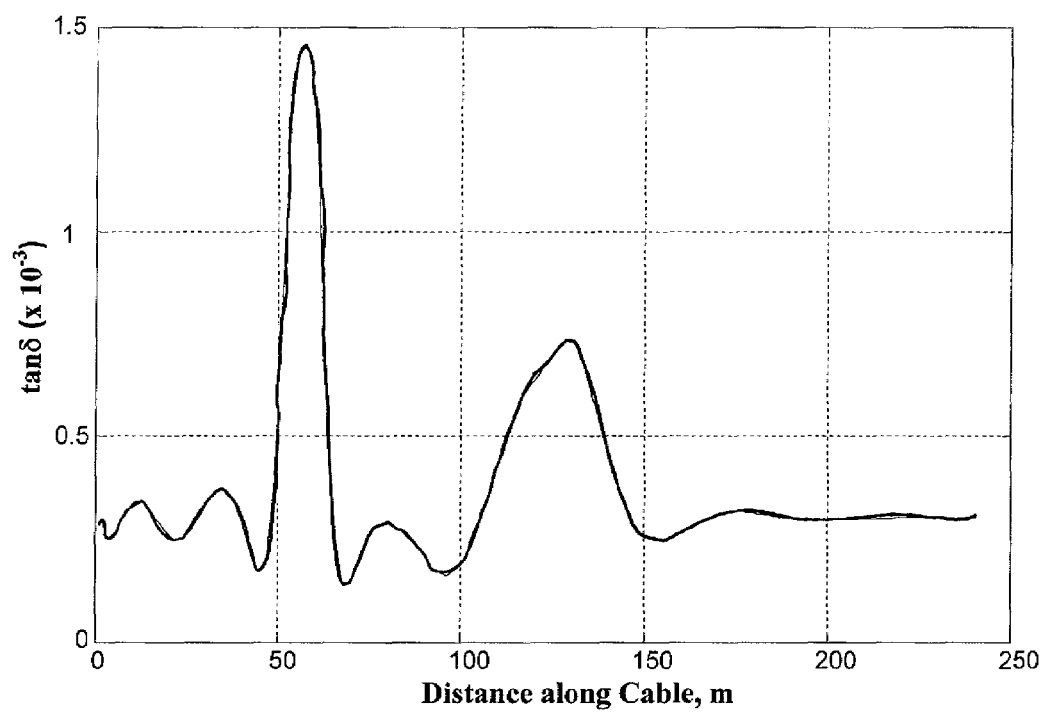
FIGS. 15-16 are exemplary "tomograms" of a cable having two defective areas with elevated tan δ and dielectric constant.
Figure 16:
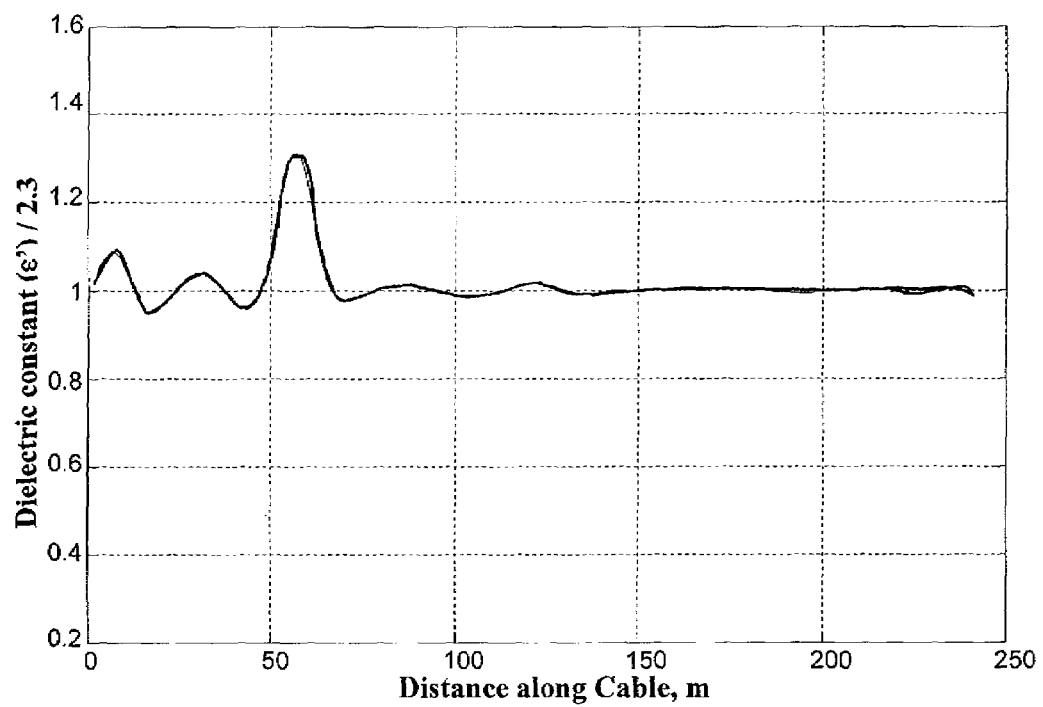

FIG. 15 and FIG. 16 are exemplary axial tomograms obtained on a 240 m long cable model in which two areas with elevated tan $\delta = \epsilon''/\epsilon'$ and one area with elevated dielectric constant, $\epsilon'$, were simulated.

The foregoing method allows the determination of a dissipation factor profile along the cable length using a broad range of excitation frequencies, e.g., frequencies of 10-1000 kHz. In order to perform the disclosed axial tomography technique using significantly lower frequencies, e.g., frequencies of 50/60 Hz, 1 Hz or 0.1 Hz, or other, the amplitude $V_m$ of the excitation voltage is generally modulated with the lower desired frequency. The result is an "amplitude-modulated" excitation source described mathematically as:

$$V = V_m \sin(\omega_1 t)\sin(\omega t) \quad [6]$$

where $\omega_1$ is the lower modulating frequency (e.g., 60 Hz or 0.1 Hz). With appropriate circuitry and/or software, the power associated with each of the two frequencies, $\omega$ and $\omega_1$, can be separated. Thus, the dissipation factor profile at each of these frequencies can be calculated according to the mathematical techniques described above. The use of this amplitude-modulated technique allows "dielectric spectroscopy" to be performed by means of axial tomography (spectro-tomography).

Thus, in an exemplary embodiment, the disclosed cable detection method/technique involves the following steps:

(a) connecting an alternating voltage source to a cable at a "sending end" thereof;

(b) applying a voltage to the cable at a first frequency to set up a traveling wave along the cable that is reflected at the "receiving end" thereof;

(c) permitting a standing wave pattern to be established along the cable by the traveling wave and the reflection thereof;

(d) measuring the total complex power loss ($S_{in}$) at the sending end of the cable;

(e) measuring or calculating the complex power, ($S_L$), dissipated in the load impedance ($Z_L$);

(f) repeating the foregoing steps while one of: (1) varying at least one of (i) the load impedance ($Z_L$) connected at the receiving end of the cable, (ii) the first frequency of the voltage source, (iii) the output impedance of the voltage source, (iv) a combination of the load impedance ($Z_L$), the output impedance of the voltage source, and the first frequency of the voltage source, and (v) combinations thereof, (2) interchanging sending and receiving cable ends and (3) a combination thereof;

(g) calculating the standing wave voltage at any point/section of the cable based on the load impedance ($Z_L$) connected at the receiving end of the cable, and the characteristic impedance ($Z_O$) of the cable, or by solving the discrete circuit model of the cable as shown in FIG. 13(a), the global cable parameters, Rc, Lc, C and R, having been determined through measurements of voltage and current at the sending and receiving cable ends under specific load conditions;

(h) calculating the complex power loss, $S_c$, in the conductor system;

(i) determining the dissipation factor, tan δ, and the dielectric constant, ε', at predetermined points/sections along the axis of the cable;

(j) re-calculating the voltage and current profiles according to the new values of cable parameters;

(k) determining the values of conductor resistance (Rc) and inductance (Lc)

(l) if warranted, repeating (g) through (k) with corrected cable parameters.

The characteristic impedance, $Z_0$, of the cable can be obtained through theoretical calculations or by direct measurement, according to one of the following exemplary methods:

(1) Measuring the voltage, $V_{in}$, across the cable and the current, $I_{in}$, into the cable at the voltage source end while the load impedance is zero (short circuit) or infinite (open circuit). The short circuit impedance is defined as $Z_{sc}=V_{in}/I_{in}$ when the load is zero. The open circuit impedance is defined as $Z_{oc}=V_{in}/I_{in}$ when the load is infinite. The cable characteristic impedance is then equal to the square root of the product of $Z_{sc}$ and $Z_{oc}$.

(2) Changing the load impedance $Z_L$ until the voltage $V_{in}$ at the source end of the cable and the voltage $V_L$ across the load are equal. This occurs when $Z_L$ is equal to $Z_0$. The ratio of $Z_{sc}$ and $Z_{oc}$ can also be used to determine the propagation constant of the cable (phase constant and attenuation) as well as velocity of propagation, provided the cable length is known.

In a further exemplary embodiment of the present disclosure, the results obtained by partial discharge and axial tomography may be combined, thereby providing a powerful diagnostic tool that is vastly superior to all presently existing tools.

Mixed Cable Systems

The methods, systems and apparatus of the present disclosure also have advantageous applicability to mixed cable systems, i.e., cable systems where two or more cable types, such as extruded polymer and oil-impregnated laminated insulation, are interconnected to each other. These cables have different characteristic impedance, $Z_0$, and velocity. Equations can be written based on each cable's "input impedance", $Z_{in}$, its length, the velocity of the electromagnetic wave associated with it, and the frequency of the voltage source. These equations will allow the determination of the voltage at each point along the mixed cable system. The velocity/cable length can be measured from a time-domain reflectometry (TDR) test, as is known from prior art partial discharge tests performed by the assignee of the present application, or can be estimated by calculation.

Branched Cable Systems

Cable systems with multiple branches can be successfully tested according to the present disclosure, provided a variable load impedance is connected to the end of each branch. The voltage calculations can, as well, be accomplished by means of the input impedance formulas described herein.

Hardware Configuration

Figure 4:
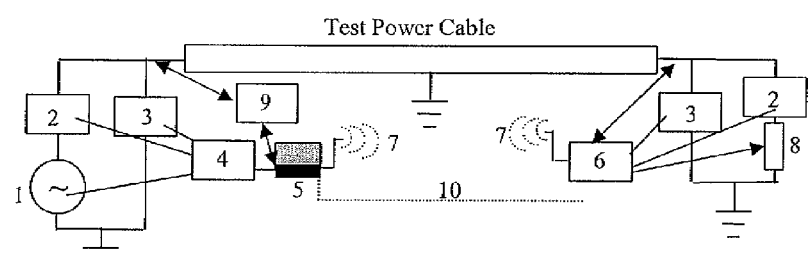
FIG. 4 is a schematic diagram of an exemplary system for implementing the disclosed methods/techniques.

An exemplary system configuration for practicing the methods/techniques of the present disclosure is illustrated in FIG. 4. In the schematic illustration of FIG. 4, the noted components are as follows:

Element 1: Remotely controllable, amplitude modulated variable frequency voltage source;
Element 2: Current measuring device;
Element 3: Voltage measuring device;
Element 4: Digitizer;
Element 5: Microcomputer with means to communicate with digitizer/receiver/transmitter (element 6) by wireless or through power or optical cable;
Element 6: Digitizer/receiver/transmitter communicating with microcomputer (element 5) and/or control console (element 9) by wireless or through power/optical cable;
Element 7: Wireless communication system;
Element 8: Remotely controllable variable impedance;
Element 9: Operator remote control console;
Element 10: Fiber-optic communication system.

Thus, as schematically depicted in FIG. 4, at the near-end (or sending-end) of the cable, the system may include:

A controllable variable frequency or amplitude-modulated variable frequency (for the spectro-tomography test) source with a variable series impedance, Zs;

One or more devices for measuring the instantaneous voltage and current;

A digitizer to digitize the measurements;

A microcomputer to compute power and the voltage profile along the cable; and

A control console for the operator with means to communicate remotely with the load-end by wireless or through the power cable under test;

Analog or digital filters, as needed, to separate the modulating frequencies from the high "carrier" frequencies.

At the remote-end, the following hardware is provided according to the exemplary embodiment depicted in FIG. 4:

A remotely controllable load impedance,

A voltage/current measuring device; and

A digitizer and means to communicate with the near-end microcomputer by a wireless system or through the power cable itself A computer/processor is generally provided to solve the set of "n" (or more) equations with "n" unknown quantities to yield the dissipation factor values at each of the "n" sections of the cable. The computer/processor is generally adapted to run system software that is adapted to calculate the voltage profile along the cable, the net power dissipated by the cable insulation for each setting of the load impedance, and the solution of the system of "n" (or more) equations with "n" unknown tan δ and ε' values. In addition, the software will include means to display the tomograms (tan δ versus cable position) and to perform filtering operations on the data. The programming of such software is well within the skill of persons of ordinary skill in the art, based on the disclosure set forth herein as to the "n" (or more) equations to be simultaneously solved according to the present disclosure.

Although the methods, system and apparatus for diagnostic testing of cables has been described herein with reference to exemplary embodiments thereof, the present disclosure is not limited to such exemplary embodiments. Rather, the disclosed methods, systems and apparatus are subject to variations, modifications and/or enhancements without departing from the spirit or scope of the present disclosure. Such variations, modifications and enhancements are expressly encompassed within the scope of the present disclosure.

The invention claimed is:

1. A method for cable testing, comprising:

calculating a dissipation factor (tan δ) and a dielectric constant (ε') at a predetermined point along the axis of the cable based, at least in part, on a standing wave established on such cable; and taking at least one action with respect to the cable based on the calculated dissipation factor (tan δ) and dielectric constant (ε') for such predetermined point of the cable at various operating frequencies, wherein the at least one action includes identifying or locating a cable defect based at least in part on the calculated dissipation factor or the calculated dielectric constant.

2. A method according to claim 1, wherein at least one of the dissipation factor (tan δ) and the dielectric constant (ε') for a given point of the cable is used to identify a cable defect.

3. The method according to claim 1, wherein the cable is a shielded power cable.

4. The method according to claim 1, wherein dissipation factors and dielectric constants are calculated at a plurality of points along the cable.

5. The method according to claim 4, wherein cable characteristic impedances are calculated at the plurality of points along the cable.

6. The method according to claim 4, wherein the plurality of calculated dissipation factors and dielectric constants are effective to functionally establish at least one of an axial tomographic rendering and a spectro-tomographic rendering of cable condition.

7. A method according to claim 1, wherein said cable is selected from the group consisting of a linear cable, a mixed cable, a branched cable, and combinations thereof.

8. A system for cable testing, comprising:
   a. a controllable variable frequency source and its series impedance, Zs;
   b. at least one device for measuring at least one of instantaneous voltage and instantaneous current at a first end of a cable;
   c. a filter for separating modulated frequencies from carrier frequencies at the first end of the cable;
   d. a processing unit that is adapted to calculate a dissipation factor (tan δ) and dielectric constant (ε') at a predetermined point along the axis of the cable based, at least in part, on a standing wave established on such cable at the first end of the cable;
   e. a controllable load impedance at a second end of the cable;
   f. a measuring device adapted to measure at least one of voltage and current at the second end of the cable; and
   g. communication means for transmission of data between the controllable load impedance, the measuring device at the second end of the cable, and the processing unit to permit identification or location of a cable defect based at least in part on the calculated dissipation factor or the calculated dielectric constant.

9. The system according to claim 8, wherein the processing unit is adapted to solve "n" or more equations with "n" unknown quantities to yield dissipation factor values at each of "n" sections of the cable.

10. The system according to claim 8, wherein the controllable variable frequency source is adapted to modulate with a lower frequency at a first cable end.

11. The system according to claim 8, further comprising digitizing units that are adapted to digitize at least one of voltage and current measurements.

12. The system according to claim 8, further comprising a control console in communication with at least one system component.

13. The system according to claim 12, wherein the control console communicates with one or more system components through wireless signals or through the test cable itself.

14. A method for performing diagnostic testing of a cable, comprising:
   a. connecting an alternating voltage source to a cable at a "sending end" thereof;
   b. applying a voltage to the cable at a first frequency to set up a traveling wave along the cable that is reflected at a "receiving end" thereof;
   c. permitting a standing wave pattern to be established along the cable by the traveling wave and the reflection thereof;
   d. measuring the total complex power loss ($S_{in}$) at the sending end of the cable;
   e. measuring or calculating the complex power ($S_L$) dissipated in the load impedance ($Z_L$) and ($S_c$) in the cable conductor;
   f. repeating the foregoing steps while one of: (1) varying at least one of (i) the load impedance ($Z_L$) connected at the receiving end of the cable, (ii) the first frequency of the voltage source, (iii) the output impedance of the voltage source, (iv) a combination of the load impedance ($Z_L$), the output impedance of the voltage source and the first frequency of the voltage source, and (v) combinations thereof, (2) interchanging the sending and receiving cable ends and (3) a combination thereof;
   g. calculating the standing wave voltage at at least one point of the cable based on the load impedance ($Z_L$) connected at the receiving end of the cable, and the characteristic impedance ($Z_O$) of the cable, or the solution of the discrete cable representation whose global parameters have been determined by measurement and calculation;
   h. determining a dissipation factor (tan δ) and a dielectric constant (ε') at a predetermined point along the axis of the cable; and
   i. identifying or locating a cable defect based at least in part on the calculated dissipation factor or the calculated dielectric constant.

15. The method according to claim 14, wherein the first frequency is between about 10 kHz and 1000 kHz.

16. The method according to claim 14, wherein an amplitude of the first frequency is modulated at a relatively low frequency.

* * * * *